(12) United States Patent
Cheng et al.

(10) Patent No.: US 7,898,014 B2
(45) Date of Patent: Mar. 1, 2011

(54) SEMICONDUCTOR DEVICE STRUCTURES WITH SELF-ALIGNED DOPED REGIONS AND METHODS FOR FORMING SUCH SEMICONDUCTOR DEVICE STRUCTURES

(75) Inventors: Kangguo Cheng, Beacon, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 11/393,142

(22) Filed: Mar. 30, 2006

(65) Prior Publication Data

US 2007/0235833 A1    Oct. 11, 2007

(51) Int. Cl.
H01L 27/108    (2006.01)
(52) U.S. Cl. ......... 257/302; 257/288; 257/296; 257/301; 257/303; 257/304; 257/E27.096; 438/249
(58) Field of Classification Search .................. 257/302, 257/E27.096, 288, 296, 301–304; 438/249
See application file for complete search history.

(56) References Cited

U.S. PATENT DOCUMENTS

| | | | |
|---|---|---|---|
| 5,198,382 A * | 3/1993 | Campbell et al. | 438/385 |
| 5,519,236 A * | 5/1996 | Ozaki | 257/302 |
| 5,784,311 A | 7/1998 | Assaderaghi et al. | |
| 5,827,765 A | 10/1998 | Stengl et al. | |
| 5,831,301 A | 11/1998 | Horak et al. | |
| 5,923,971 A | 7/1999 | Ho et al. | |
| 5,945,707 A | 8/1999 | Bronner et al. | |
| 5,949,700 A | 9/1999 | Furukawa et al. | |
| 5,953,607 A | 9/1999 | Hakey et al. | |
| 5,998,253 A | 12/1999 | Loh et al. | |
| 6,110,792 A | 8/2000 | Bronner et al. | |
| 6,121,651 A | 9/2000 | Furukawa et al. | |
| 6,144,054 A | 11/2000 | Agahi et al. | |
| 6,153,902 A | 11/2000 | Furukawa et al. | |
| 6,163,045 A | 12/2000 | Mandelman et al. | |
| 6,177,696 B1 | 1/2001 | Bronner et al. | |
| 6,180,975 B1 | 1/2001 | Radens et al. | |
| 6,184,549 B1 | 2/2001 | Furukawa et al. | |
| 6,190,971 B1 | 2/2001 | Gruening et al. | |

(Continued)

OTHER PUBLICATIONS

Office Action issued in related U.S. Appl. No. 11/876,116 dated Oct. 1, 2009.

*Primary Examiner* — Matthew E Warren
*Assistant Examiner* — John Lin
(74) *Attorney, Agent, or Firm* — Wood, Herron & Evans, LLP

(57) ABSTRACT

Semiconductor device structures with self-aligned doped regions and methods for forming such semiconductor device structures. The semiconductor structure comprises first and second doped regions of a first conductivity type defined in the semiconductor material of a substrate bordering a sidewall of a trench. An intervening region of the semiconductor material separates the first and second doped regions. A third doped region is defined in the semiconductor material bordering the sidewall of the trench and disposed between the first and second doped regions. The third doped region is doped to have a second conductivity type opposite to the first conductivity type. Methods for forming the doped regions involve depositing either a layer of a material doped with both dopants or different layers each doped with one of the dopants in the trench and, then, diffusing the dopants from the layer or layers into the semiconductor material bordering the trench sidewall.

18 Claims, 8 Drawing Sheets

U.S. PATENT DOCUMENTS

| | | | |
|---|---|---|---|
| 6,201,272 B1 | 3/2001 | Kotecki et al. | |
| 6,204,140 B1 | 3/2001 | Gruening et al. | |
| 6,225,158 B1 | 5/2001 | Furukawa et al. | |
| 6,229,173 B1 | 5/2001 | Gruening et al. | |
| 6,236,077 B1 | 5/2001 | Gambino et al. | |
| 6,242,310 B1 | 6/2001 | Divakaruni et al. | |
| 6,259,129 B1 | 7/2001 | Gambino et al. | |
| 6,281,539 B1 | 8/2001 | Mandelman et al. | |
| 6,284,593 B1 | 9/2001 | Mandelman et al. | |
| 6,285,054 B1 | 9/2001 | Liu et al. | |
| 6,288,422 B1 | 9/2001 | Mandelman et al. | |
| 6,310,375 B1 | 10/2001 | Schrems | |
| 6,339,241 B1 | 1/2002 | Mandelman et al. | |
| 6,369,419 B1 | 4/2002 | Divakaruni et al. | |
| 6,373,086 B1 | 4/2002 | Mandelman et al. | |
| 6,376,324 B1 | 4/2002 | Mandelman et al. | |
| 6,399,978 B2 | 6/2002 | Gruening et al. | |
| 6,399,987 B2 | 6/2002 | Kim | |
| 6,406,970 B1 | 6/2002 | Kudelka et al. | |
| 6,420,750 B1 | 7/2002 | Divakaruni et al. | |
| 6,426,252 B1 | 7/2002 | Radens et al. | |
| 6,426,526 B1 | 7/2002 | Divakaruni et al. | |
| 6,437,381 B1 | 8/2002 | Gruening et al. | |
| 6,437,401 B1 | 8/2002 | Mandelman et al. | |
| 6,440,872 B1 | 8/2002 | Mandelman et al. | |
| 6,451,648 B1 | 9/2002 | Gruening et al. | |
| 6,452,224 B1 * | 9/2002 | Mandelman et al. | 257/296 |
| 6,518,119 B2 | 2/2003 | Gambino et al. | |
| 6,555,862 B1 | 4/2003 | Mandelman et al. | |
| 6,563,160 B2 | 5/2003 | Clevenger et al. | |
| 6,566,191 B2 | 5/2003 | Hsu et al. | |
| 6,570,207 B2 | 5/2003 | Hsu et al. | |
| 6,570,208 B2 | 5/2003 | Mandelman et al. | |
| 6,573,137 B1 | 6/2003 | Divakaruni et al. | |
| 6,576,945 B2 | 6/2003 | Mandelman et al. | |
| 6,599,798 B2 | 7/2003 | Tews et al. | |
| 6,605,838 B1 | 8/2003 | Mandelman et al. | |
| 6,630,379 B2 | 10/2003 | Mandelman et al. | |
| 6,642,566 B1 | 11/2003 | Mandelman et al. | |
| 6,653,678 B2 | 11/2003 | Chidambarrao et al. | |
| 6,670,235 B1 | 12/2003 | Tews et al. | |
| 6,703,274 B1 | 3/2004 | Chidambarrao et al. | |
| 6,707,095 B1 | 3/2004 | Chidambarrao et al. | |
| 6,720,602 B2 | 4/2004 | Clevenger et al. | |
| 6,723,662 B2 * | 4/2004 | Lee et al. | 438/774 |
| 6,724,031 B1 | 4/2004 | Akatsu et al. | |
| 6,727,141 B1 | 4/2004 | Bronner et al. | |
| 6,727,539 B2 | 4/2004 | Divakaruni et al. | |
| 6,759,291 B2 | 7/2004 | Divakaruni et al. | |
| 6,759,702 B2 | 7/2004 | Radens et al. | |
| 6,767,789 B1 | 7/2004 | Bronner et al. | |
| 6,808,981 B2 | 10/2004 | Mandelman et al. | |
| 6,809,368 B2 | 10/2004 | Divakaruni et al. | |
| 6,815,749 B1 | 11/2004 | Mandelman et al. | |
| 6,833,305 B2 | 12/2004 | Mandelman et al. | |
| 6,936,512 B2 | 8/2005 | Chudzik et al. | |
| 6,979,851 B2 | 12/2005 | Chidambarrao et al. | |
| 7,023,041 B2 | 4/2006 | La Rosa et al. | |
| 2003/0116784 A1 | 6/2003 | Divakaruni et al. | |
| 2003/0178662 A1 | 9/2003 | Voigt et al. | |
| 2007/0042550 A1 | 2/2007 | Vannucci et al. | |

* cited by examiner

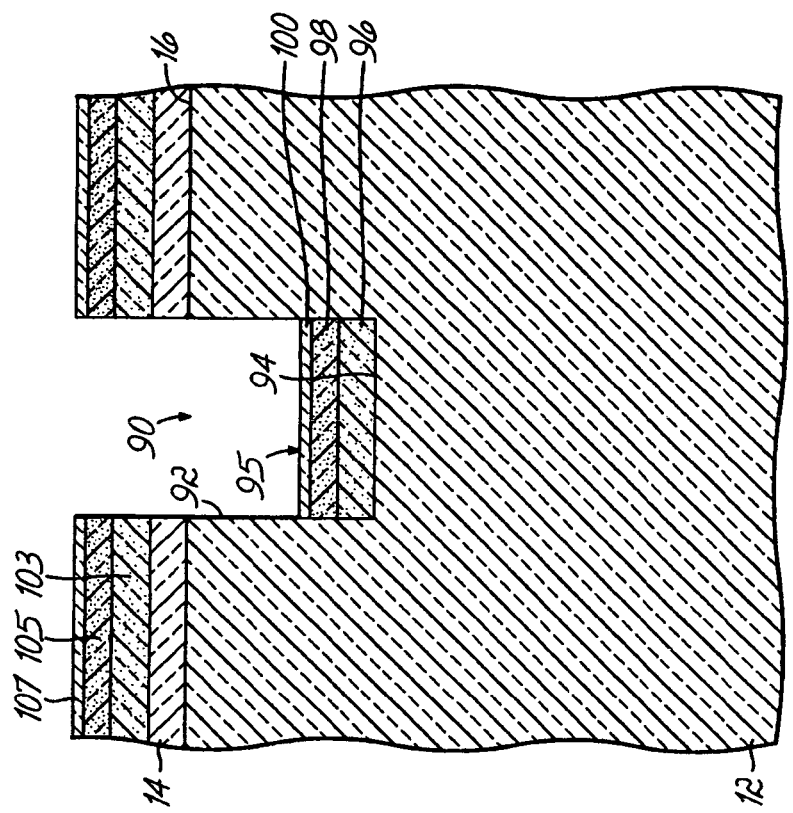
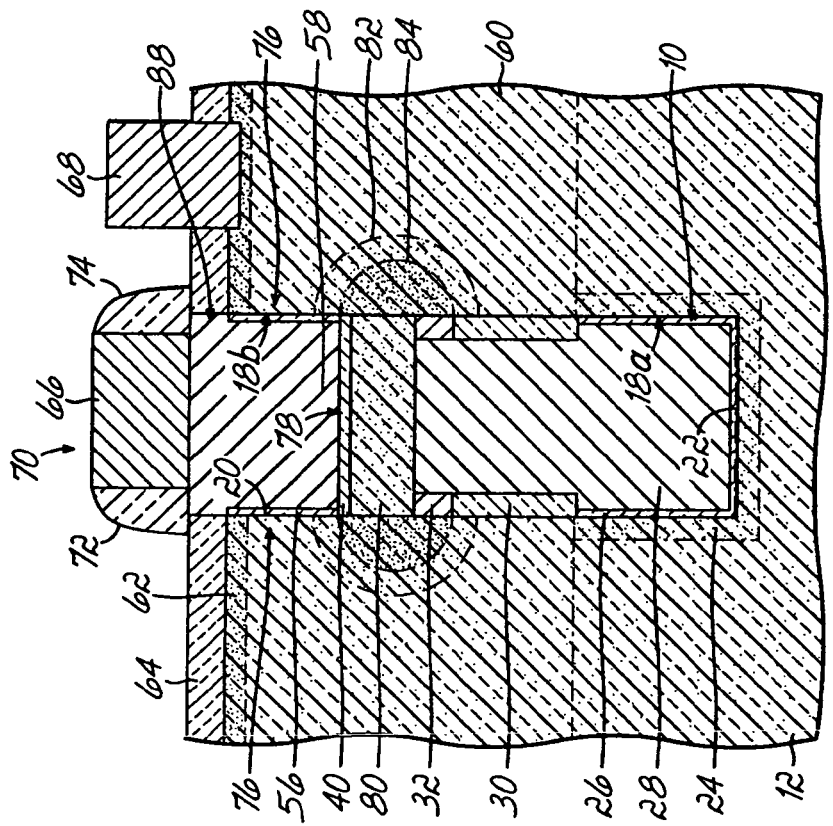
FIG. 8
FIG. 7

SEMICONDUCTOR DEVICE STRUCTURES WITH SELF-ALIGNED DOPED REGIONS AND METHODS FOR FORMING SUCH SEMICONDUCTOR DEVICE STRUCTURES

FIELD OF THE INVENTION

The invention relates generally to semiconductor device structures and, in particular, to semiconductor device structures with self-aligned doped regions and methods of forming such semiconductor device structures.

BACKGROUND OF THE INVENTION

Dynamic random access memory (DRAM) devices are the most common type of semiconductor memory used for data storage and, as a consequence, are found in many integrated circuit designs. A generic DRAM device includes a plurality of substantially identical semiconductor memory cell arrays, a plurality of bit lines, and a plurality of word lines that intersect the bit lines. Each memory cell array consists of multiple memory cells arranged in a matrix of addressable rows and columns. One of the word lines and one of the bit lines intersects the location of each individual memory cell in the memory cell array.

Each individual memory cell includes a storage capacitor for storing data and a transistor, such as a planar or vertical metal oxide semiconductor field effect transistor (MOSFET) or a fin-type field effect transistor (FinFET), serially connected with the storage transistor. One of the source/drain regions of the field effect transistor is electrically connected to a corresponding bit line and a gate electrode of the field effect transistor is electrically connected to a corresponding word line. During read and write operations, the field effect transistor controls the transfer of data charges to and from the storage capacitor. Because DRAM devices are volatile and thus leak stored charge, the data charge on the storage capacitor of each memory cell is periodically refreshed during a refresh operation.

When a signal routed on a word line activates the field effect transistor of one of the memory cells, the storage capacitor of the activated memory cell transfers a data signal to the bit line connected to the memory cell or a data signal from the bit line to the storage capacitor of the memory cell. When data stored in one of the memory cells is read onto one of the bit lines, a potential difference is generated between the bit line of the respective memory cell and the bit line of another memory cell, which form a bit line pair. A bit line sense amplifier connected to the data line pair senses and amplifies the potential difference and transfers the data from the selected memory cells to a data line pair.

One goal of memory device designers is to more densely pack memory cells into a smaller integrated circuit. Vertical memory cells feature an architecture in which the storage capacitor and transistor are stacked vertically in a narrow common trench. Vertical memory cells afford increased packing densities and other advantages in comparison to planar memory cells, in which size reduction was realized in the past primarily by reduction of the minimum lithographic feature size. For example, the packing density of vertical memory cells in a DRAM device is greater because the channel length of the vertical transistor is not constrained by lithography and the value of the minimum lithographic feature size. Instead, the channel length of the vertical transistor is determined by the depth of a recess. Consequently, vertical transistors used in memory cells lack the scaling problems associated with, for example, reducing the gate-oxide thickness and increasing the channel doping concentration encountered when scaling planar transistors to smaller sizes.

To provide the shortest possible channel length and highest on-current of the vertical transistor, for meeting performance objectives, the depth of the recess that determines channel length should be minimized. However, minimization of channel the channel length of the vertical transistor requires that short channel effects be addressed. One approach, which has transferred over from planar device technologies, involves forming pocket or halo regions circumscribing the diffusions defining the source/drain regions of the vertical transistor. The halo regions are of the opposite conductivity or doping polarity (either N-type or P-type) from the source/drain regions, which assists in controlling source to drain leakage currents between the source/drain regions when the vertical transistor is quiescent or idle (i.e., switched to an "off" state). In planar device technologies, the halo regions are defined adjacent to the extensions of the source/drain regions by an angled ion implantation that extends into the semiconductor material beneath the gate electrode. Unfortunately, angled ion implantation cannot define analogous halo regions in vertical transistors because the vertical transistor is formed in a narrow trench. Because of shadowing effects, the high aspect ratio of the trench severely limits any halo implantation to a rather steep angle of incidence. Even if shadowing effects were somehow overcome to permit the use of angled ion implantation to form halo regions, variations in the trench diameter across the substrate would hamper process control.

What is needed, therefore, are semiconductor device structures and fabrication methods in which short channel effects are suppressed and other disadvantages of conventional vertical transistor device structures and methods of manufacturing such vertical transistor device structures are alleviated.

SUMMARY OF THE INVENTION

In accordance with an embodiment of the present invention, a semiconductor device structure is formed in a trench defined in a substrate of a semiconductor material by a sidewall extending from a top surface of the substrate to a base. The semiconductor device structure comprises a first doped region and a second doped region each defined in the semiconductor material of the substrate bordering the sidewall of the trench, the first and second doped regions having a first conductivity type and being separated by an intervening region of the semiconductor material. The semiconductor device structure further comprises a third doped region defined in the semiconductor material of the substrate bordering the sidewall of the trench. At least a portion of the third doped region is positioned between the first doped region and the intervening region of the semiconductor material of the substrate. The third doped region is doped to have a second conductivity type opposite to the first conductivity type of the first and second doped regions. In certain embodiments of the present invention, the first and second doped regions may advantageously comprise first and second source/drain regions of a field effect transistor, the intervening region comprises a channel region of the field effect transistor, and the third doped region comprises a halo region disposed between the second source/drain region and the channel region. In addition, in some embodiments, a storage capacitor may be formed in the trench and electrically coupled with the field effect transistor to define a memory cell.

In accordance with another aspect of the present invention, a method is provided for fabricating a semiconductor device structure in a trench defined in a substrate of a semiconductor material by a sidewall extending from a top surface of the substrate to a base. The method comprises depositing at least one doped layer in the trench that includes a first dopant of a first conductivity type and a second dopant of a second conductivity type opposite to the first conductivity type. The method further comprises diffusing the first and second dopants from the at least one doped layer into the semiconductor material bordering at least the sidewall of the trench to form, respectively, a first doped region of the first conductivity type and a second doped region of the second conductivity type that is self-aligned with the first doped region. In a specific embodiment, the first doped region may comprise a source/drain region of a field effect transistor and the second doped region may comprise a halo region of the field effect transistor.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 5-7 are diagrammatic cross-sectional views of a portion of a substrate at successive fabrication stages of a processing method in accordance with an embodiment of the present invention.

FIGS. 8-10 are diagrammatic cross-sectional views of a portion of a substrate at successive fabrication stages of a processing method in accordance with an embodiment of the present invention.

DETAILED DESCRIPTION

Figure 2:
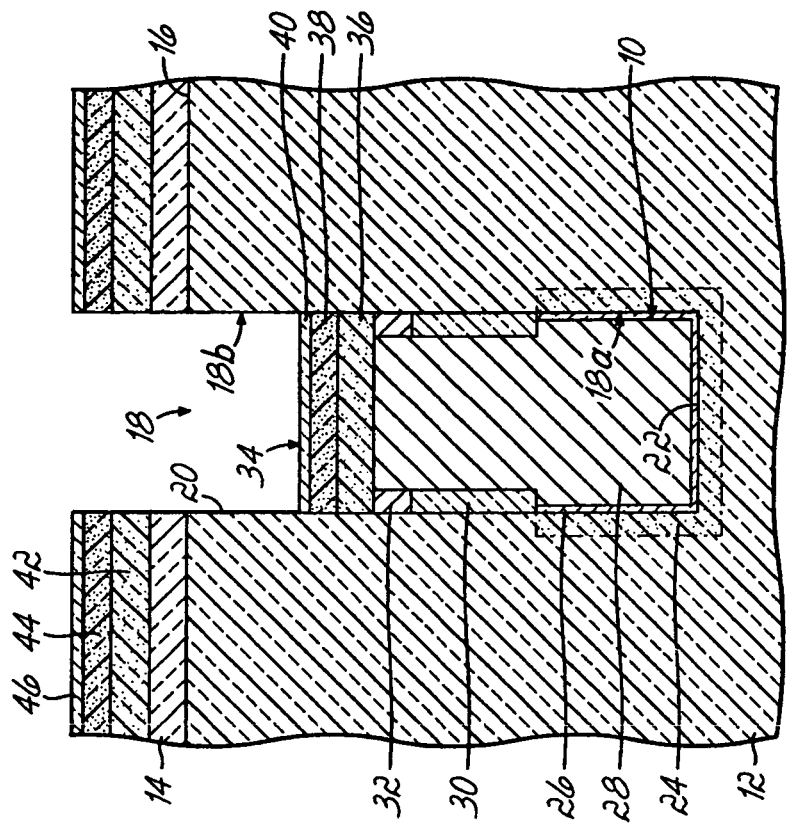
FIGS. 1-4 are diagrammatic cross-sectional views of a portion of a substrate at successive fabrication stages of a processing method in accordance with an embodiment of the present invention.

The present invention is generally directed to semiconductor structures and fabrication methods that provide a robust, manufacturable process for forming pocket or halo regions in a vertical transistor. The present invention permits precise self-alignment of doped regions forming halo regions relative to the doped regions forming source/drain regions and/or source/drain extensions. The present invention overcomes the deficiencies of angled implantation so that lightly doped drain (LDD) extensions and halo regions may be formed at the upper portion of the vertical transistor channel, as well as the lower portion of a vertical transistor channel. Generally, the present invention addresses the scalability of the channel length for transistors having vertically oriented channels, which are commonly used in conjunction with storage capacitors for controlling the transfer of data charges to and from the storage capacitor in memory cells but also may be found in other semiconductor device structures. The present invention will now be described in greater detail by referring to the drawings that accompany the present application.

For purposes of illustration, certain embodiments of the present invention are described in the context of a vertical transistor for use in a memory cell of a DRAM device, such as an embedded DRAM. However, the present invention may be advantageous for use in trench capacitor memory cells employed in other types of integrated circuits such as, for example, random access memories (RAMs), static RAMs (SRAMs), and read only memories (ROMs). The present invention, as described, is also advantageous for forming vertical transistors that are not associated with a memory cell.

For purposes of description, the invention is described in the context of forming a single memory cell and/or vertical transistor with the understanding that multiple replicas of the memory cell and/or vertical transistor are formed across the substrate in order to define the integrated circuit. It is further understood that each of the memory cells and/or vertical transistors includes a structure consistent with the principles of the invention.

Figure 1:
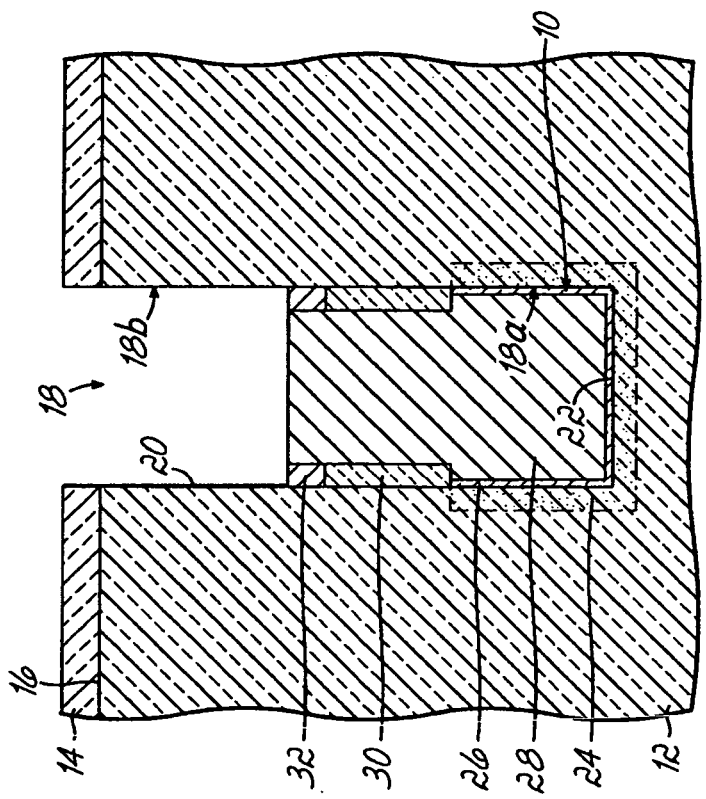

With reference to FIG. 1 and in accordance with an embodiment of the present invention, a storage capacitor 10 is formed by standard fabrication stages as one of a plurality of substantially identical storage capacitors distributed across a substrate 12, often with a matrix arrangement. The substrate 12 may be any suitable bulk substrate of semiconductor material that a person having ordinary skill in the art would recognize as suitable for forming an integrated circuit. Advantageously, substrate 12 may be any type of conventional monocrystalline semiconductor substrate, such as the illustrated bulk silicon substrate, or, for example, the active monocrystalline semiconductor layer of a semiconductor-on-insulator (SOI) substrate. Alternatively, the substrate 12 may be composed of other semiconductor materials, such as silicon-germanium.

A pad layer 14 covers a top surface 16 of the substrate 12. Pad layer 14, which operates as a hard mask, may be composed of a dielectric such as silicon nitride ($Si_3N_4$) formed by a conventional deposition process, such as a thermal chemical vapor deposition (CVD) process or a plasma-enhanced chemical vapor deposition (PECVD) process. The material forming pad layer 14 must also etch selectively to the material constituting the substrate 12. A comparatively thin pad layer (not shown) of a different dielectric material may be provided between the substrate 12 and pad layer 14 to define a layer stack. This optional pad layer, which may be silicon oxide ($SiO_2$) grown by exposing substrate 12 to either a dry oxygen ambient or steam in a heated environment, may operate as a buffer layer to prevent any stresses in the thicker pad layer 14 from causing dislocations in the semiconductor material of substrate 12.

Deep trenches, of which deep trench 18 is representative, are formed by a conventional lithography and etching process at locations dispersed across the surface of substrate 12. The lithography process applies a resist (not shown) on pad layer 14, exposes the resist to a pattern of radiation to impart a latent deep trench pattern, and develops the latent deep trench pattern in the exposed resist. The deep trench pattern is subsequently transferred from the resist to the pad layer 14 using the patterned resist as an etch mask for an anisotropic dry etching process, such as a reactive-ion etching (RIE) process or a plasma etching process. After the resist is removed by ashing or solvent stripping, the deep trench pattern is transferred from the pad layer 14 to the substrate 12 another anisotropic etch process relies on the patterned pad layer 14 as a hardmask. The etch process removes the constituent material of the substrate 12 across areas of top surface 16 exposed through the deep trench pattern defined in the pad layer 14. The total depth of the deep trench 18 is determined by the desired capacitor specifications, but has sufficient depth to insure adequate capacitance for the storage capacitor 10. The deep trench 18 has a sidewall 20 that encircles the deep trench 18 to define a peripheral boundary of the open space and extends in a direction substantially perpendicular or vertical to the top surface 16 of the substrate 12. A bottom wall or base 22 defines a bottom boundary of the deep trench 18 in the substrate 12.

A buried capacitor plate 24 is present in the semiconductor material of the substrate 12 about the deep trench 18 as a heavily doped region. Specifically, the buried capacitor plate 24 borders the sidewall 20 and base 22 in a lower portion 18a of the deep trench 18. The buried capacitor plate 24 may be heavily doped with, for example, an n-type dopant. Buried plate doping may be formed by a conventional process such as a high temperature drive-in process that outdiffuses a dopant, such as the n-type dopant arsenic, from a doped silicate glass layer formed in the lower portion 18a of deep trench 18 on sidewall 20 and base 22. The glass layer is then capped by a cap layer. After the dopant has penetrated a suitable distance into the constituent material of substrate 12 to form the buried capacitor plate 24, the cap layer and glass layer are removed in a subsequent etching process (e.g., a wet etch). Other methods of introducing a dopant into the lower portion 18a of deep trench 18 to form buried capacitor plate 24 include gas phase doping, liquid phase doping, plasma doping, infusion doping, plasma immersion ion implantation, or any combination of these processes that are familiar to a person having ordinary skill in the art. The buried capacitor plate 24 is tied to a reference potential or voltage.

After the buried capacitor plate 24 is defined, a thin node dielectric 26 is formed that lines the sidewall 20 and base 22 of the lower portion 18a of the deep trench 18. The node dielectric 26 may be any suitable dielectric material, including but not limited to silicon oxide, silicon nitride, silicon oxynitride, aluminum oxide, combinations of these dielectric materials, or another high-k material.

A node electrode 28 of storage capacitor 10, which is constituted by a conductor such as doped polycrystalline silicon (i.e., polysilicon), fills the lower portion 18a of the deep trench 18. The node electrode 28 may be composed of, for example, a heavily n-type doped polysilicon deposited by a CVD process. For example, deep trench 18 may be filled with heavily n-type doped polysilicon, which is planarized with a conventional chemical mechanical planarization (CMP) process that stops on the pad layer 14 and is recessed vertically below the exposed surface of the pad layer 14 to a depth substantially level with the top surface 16 of the substrate 12. The node dielectric 26 separates and electrically isolates the buried capacitor plate 24 from node electrode 28.

An isolation collar 30 is formed above the junction between the buried capacitor plate 24 and node electrode 28. The isolation collar 30 electrically isolates the storage capacitor 10 from other structures formed in an upper portion 18b of the deep trench 18. The isolation collar 30 may comprise a material as known and used in the art including, but not limited to, silicon dioxide, silicon nitride, and the like and may have a thickness of about three (3) nm to about fifty (50) nm.

Above the isolation collar 30, a buried strap 32 is formed in deep trench 18 that has a top surface that is substantially coplanar with the node electrode 28. The buried strap 32 electrically bridges the node electrode 28 to the substrate 12. The buried strap 32 may be formed by partially removing the isolation collar 30 and filling the vacated space with a conductor, such as undoped polysilicon or polysilicon that is heavily doped with an n-type dopant to impart n-type conductivity. Thermal diffusion of dopant from the buried strap 32, when it is doped, or from the storage capacitor node electrode 28 when the buried strap 32 is not doped, supplies an outdiffusion in the semiconductor material bounding the deep trench 18 during subsequent processing at elevated temperatures, as described below.

With reference to FIG. 2 in which like reference numerals refer to like features in FIG. 1 and at a subsequent fabrication stage, a trench top oxide 34 is then formed atop of the node electrode 28 and the buried strap 32. The trench top oxide 34 has a construction that comprises a lower doped layer 36 doped with a dopant of a first conductivity type and an upper doped layer 38 doped with a dopant of a second conductivity type opposite to the first conductivity type. The lower and upper doped layers 36, 38 supply dopant for diffusion into the substrate 12 bordering the deep trench 18 during subsequent fabrication stages. The material constituting the lower doped layer 36 may contain an n-type dopant, such as arsenic (As), phosphorous (P), antimony (Sb), if the buried strap 32 has an n-type conductivity. In this instance, the material constituting the upper doped layer 38 may contain a p-type dopant, such as boron (B) or indium (In), that has the opposite p-type conductivity. Of course, the conductivity types may be exchanged contingent upon the semiconductor device design.

Advantageously, the lower doped layer 36 may comprise arsenic-doped silicate glass (ASG). The ASG forming the lower doped layer 36 may be deposited by a CVD process, such as a high density plasma chemical vapor deposition (HDPCVD) that anisotropically deposits a thicker film on planar surfaces than on vertical surfaces, like the trench sidewall 20. Any extraneous ASG that deposits on the trench sidewall 20 may be removed by a wet etch process such as buffered hydrofluoric (BHF), or by an isotropic dry etch process such as chemical dry etch (CDE) or chemical oxide removal (COR). When removing the extraneous ASG, the etch process also slightly thins the lower doped layer 36 from its initial thickness, which is permitted because of the significant differences in relative thickness.

Advantageously, the upper doped layer 38 may comprise boron-doped silicate glass (BSG). The BSG forming the upper doped layer 38 may be deposited by a CVD process, such as HDPCVD. Any extraneous BSG that deposits on the trench sidewall 20 may be removed by a wet etch process such as BHF, or by an isotropic dry etch process such as CDE or COR. The etch process also slightly thins the upper doped layer 38 from its initial thickness, which is permitted because of the significant differences in relative thickness. The trench top oxide 34 may further include an undoped cap layer 40, which is optional, of a dielectric material such as silicate glass formed by a similar deposition method on the upper doped layer 38. In exemplary embodiments of the present invention, the individual thicknesses of the lower doped layer 36, the upper doped layer 38, and the undoped cap layer 40 each may be about five (5) nm to about twenty (20) nm, contingent upon the dimensions of deep trench 18.

The layer stack defined by the lower and upper doped layers 36, 38 and the optional cap layer 40 may be deposited serially by distinct HDPCVD process steps each followed by an etch process to remove extraneous material deposited on the trench sidewall 20. However, in an alternative embodiment of the present invention, the lower and upper doped layers 36, 38 and the optional cap layer 40 may be deposited in a single HDPCVD process by sequentially altering the dopant chemistry during deposition to change the dopant at appropriate process times. The extraneous films of ASG, BSG, and undoped silicate on trench sidewall 20 may then be concurrently removed by a single etch process. Extraneous layers 42, 44, 46 of the materials forming the layers 36, 38, 40 may be formed on the pad layer 14 when the trench top oxide 34 is formed and are removed during subsequent fabrication stages.

Figure 3:
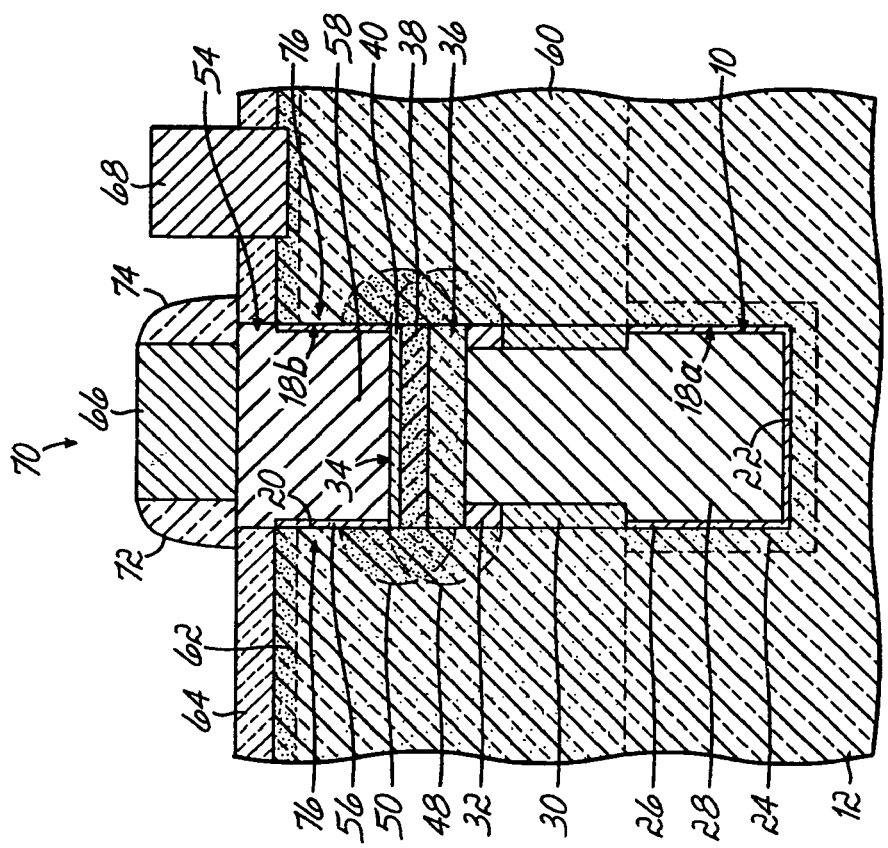

With reference to FIG. 3 in which like reference numerals refer to like features in FIG. 2 and at a subsequent fabrication stage, the trench top oxide 34 is heated by a suitable thermal anneal process to a temperature and for a duration effective to cause dopant originating from the material constituting the lower doped layer 36 and dopant originating from the constituent material of the upper doped layer 38 to outdiffuse because of the dopant concentration gradient into the semiconductor material of the substrate 12 that bounds the deep trench 18. The same thermal anneal process causes dopant originating from the material constituting the node electrode 28 and/or buried strap 32 to also outdiffuse because of the dopant concentration gradient into the semiconductor material of the substrate 12 that bounds the deep trench 18. Alternatively, subsequent fabrication stages may heat the substrate 12, buried strap 32 and trench top oxide 34 to temperatures and for a duration sufficient to cause outdiffusion.

Specifically, a lower source/drain region 48 of a vertical transistor 54 (FIG. 4) is defined by outdiffusion of the dopant (e.g., arsenic) from the storage node 28, the lower doped layer 36 of the trench top oxide 34, and the buried strap 32, if doped, that extends into the semiconductor material of the substrate 12 near the deep trench 18. The lower source/drain region 48 is located between the capacitor 10 and the top surface 16 and is self-aligned with the buried strap 32 and the lower doped layer 36. In other words, the lower source/drain region 48 is disposed at the same, or substantially the same, depth from the top surface 16 of the substrate 12 as the buried strap 32 and the lower doped layer 36. The lower source/drain region 48 may function as either a source region or a drain region contingent upon the operation of the vertical transistor 54. The node electrode 28 of storage capacitor 10 is coupled electrically with the lower source/drain region 48 by the conductive bridge supplied by the buried strap 32.

A halo region 50 is defined by outdiffusion of the dopant (e.g., boron) from the upper doped layer 38 of the trench top oxide 34 that extends into the semiconductor material of the substrate 12 near the deep trench 18. At least a portion of the halo region 50 is disposed vertically between lower source/drain region 48 and the top surface 16 of substrate 12. The halo region 50 is self-aligned with the upper doped layer 38 in that the halo region 50 is disposed at the same, or substantially the same, depth from the top surface 16 of the substrate 12 as the upper doped layer 38. The outdiffused dopant in the halo region 50 has an opposite conductivity type to the outdiffused dopant forming the lower source/drain region 48 and partially overlaps the lower source/drain region 48. The undoped cap layer 40 prevents undesired dopant diffusion to the semiconductor material of substrate 12 bordering the upper portion 18b of the deep trench 18. The optional thermal treatment forming the lower source/drain region 48 is also effective for forming the halo region 50, as potentially are subsequent thermal treatments incidental to subsequent fabrication stages.

The lower source/drain region 48 is also self-aligned with the halo region 50 because of the fixed spatial relationship in deep trench 18 between the lower doped layer 36 and the upper doped layer 38 of the trench top oxide 34 and between the lower and upper doped layers 36, 38 and the buried strap 32. The lower and upper doped layers 36, 38 and the buried strap 32, if doped, are formed from materials that include a concentration of a dopant that is mobile under appropriate thermal annealing conditions and, thus, can diffuse into the semiconductor material of the substrate 12 bordering the deep trench 18.

The dopant concentration in the lower doped layer 36 is initially chosen to be significantly higher than the dopant concentration in the upper doped layer 38 so that the upper junction between the overlapping lower source/drain region 48 and halo region 50 is at the same depth relative to, or slightly above, a top surface of the upper doped layer 38 of the trench top oxide 34. This arrangement assists in the subsequent fabrication stages that form the vertical transistor 54 on the trench sidewall 20. Advantageously, the initial dopant (e.g., arsenic) concentration in the lower doped layer 36 may be in the range of $1\times10^{19}$ cm$^{-3}$ to $1\times10^{21}$ cm$^{-3}$ and the initial dopant (e.g., boron) concentration in the upper doped layer 38 may be an order of magnitude or more (i.e., greater than a factor of 10) lower than the initial dopant concentration in the lower doped layer 36.

Figure 4:
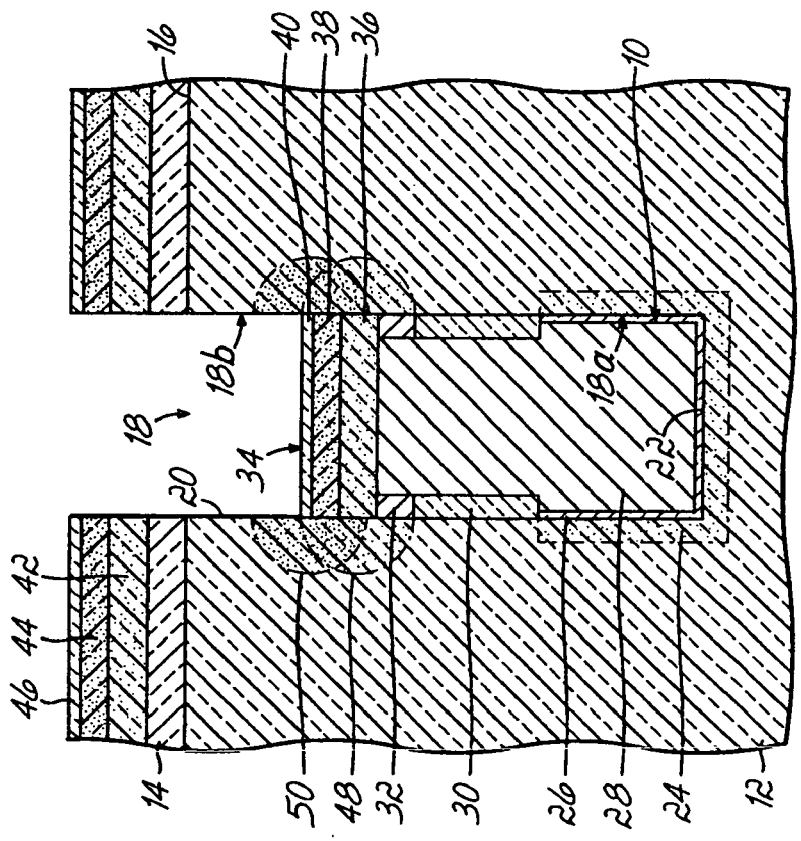

With reference to FIG. 4 in which like reference numerals refer to like features in FIG. 3 and at a subsequent fabrication stage, the vertical transistor 54 is then fabricated. A vertical gate dielectric 56 is formed on the trench sidewall 20 along the upper portion 18b of the deep trench 18. The upper portion 18b of the deep trench 18 is then filled with a conductor, such as doped polysilicon deposited using low-pressure CVD (LPCVD), to define a gate electrode 58. A p-type well 60 is formed in the semiconductor material of substrate 12 by, for example, an ion implantation process. An upper source/drain region 62 is formed by doping a surface region of the semiconductor of the substrate 12 with a dopant introduced by, for example, an ion implantation process. The dopant of the upper source/drain region 62 may comprise an n-type dopant. The undoped cap layer 40, if present, prevents cross-doping between the gate electrode 58 and the lower and upper doped layers 36, 38. The pad layer 14 and layers 42, 44, 46 are removed and replaced with a dielectric layer 64 of, for example, silicon dioxide.

A channel region 76 is defined in the semiconductor material of substrate 12 bordering the deep trench 18 near the gate electrode 58. The channel region 76 is disposed between the halo region 50 and the upper source/drain region 62 and, thus, the channel region is an intervening region of the semiconductor material of the substrate 12 between the lower and upper source/drain regions 48, 62. The channel region 76 is not doped by dopant outdiffused from the lower and upper doped layers 36, 38 nor by the process forming the upper source/drain region 62. The halo region 50 extends toward the channel region 76 and beyond an end of the lower source/drain region 48 such that the lower source/drain region 48 and the halo region 50 are at least partially non-overlapping. A portion of the halo region 50 nearest to the top surface 16 is either doped with only a negligible concentration of the dopant forming the lower source/drain region 48 or is undoped by the dopant forming the lower source/drain region 48.

A wordline 66 is formed to contact the gate electrode 58. Wordline 66 may consist of one or more conducting layers constituted by a conductor, such as polysilicon, tungsten nitride (WN), tungsten (W), tungsten silicide (WSi$_2$), or layered combinations of these materials. Electrically-insulating sidewall spacers 72, 74 of, for example, silicon nitride are formed that flank the conducting layer(s) of the word line 66. A bitline contact 68, which is formed by standard lithography and etching processes, extends through a dielectric layer 64 to contact the upper source/drain region 62. The bitline contact 68 consists of a conductive material, such as a metal or doped polysilicon. For example, the bitline contact 68 may be formed by a conventional lithography and etching process. The lithography process deposits a resist on dielectric layer 64 and patterns the resist to form a bitline contact pattern. In the subsequent etching process, the unmasked regions of the dielectric layer 64 are etched with an etchant that removes the constituent dielectric material of layer 64 selective to the constituent semiconductor material of substrate 12 to form vias extending to the source/drain region 62. After removing the resist by ashing or solvent stripping, a layer of a conductive material suitable for forming contact 68 is deposited and planarized with a conventional process, such as a CMP process, to the top of the dielectric layer 64.

The storage capacitor 10 and the vertical transistor 54 collectively define a memory cell 70. Numerous other memory cells (not shown), each substantially identical to memory cell 70 are fabricated simultaneously with memory cell 70 and are distributed across substrate 12. Memory cell 70 is isolated from other adjacent memory cells (not shown) by device isolation regions (not shown), such as dielectric-filled shallow trench isolation regions.

In use, application of an appropriate voltage to the gate electrode 58 switches the vertical transistor 54 on, enabling current to flow through the channel region 76 defined in the material of the substrate 12 between the source/drain regions 48, 62 to form an electrical connection between the storage capacitor 10 and the bitline contact 68. Switching off the vertical transistor 54 breaks this connection by preventing current flow through the channel region 76 between the source/drain regions 48, 62. The halo region 50, which has the opposite doping polarity of the lower source/drain region 48, assists in controlling source to drain leakage currents between the source/drain regions 48, 62 when the vertical transistor 54 is quiescent or idle (i.e., switched to an "off" state). As a result, the halo region 50 is effective for mitigating short-channel effects in the vertical transistor 54.

In an alternative embodiment of the present invention, a trench top oxide may comprise a single doped layer of a material that contains two dopants of opposite conductivity types. One of the dopants is thermally outdiffused into the semiconductor material of the substrate 12 bordering the deep trench 18 to cooperate with outdiffused dopant from the buried strap 32 to form a lower source/drain region analogous to lower source/drain region 48 (FIG. 3). The other of the dopants is thermally outdiffused to form a halo region analogous to halo region 50 (FIG. 3).

Figure 5:
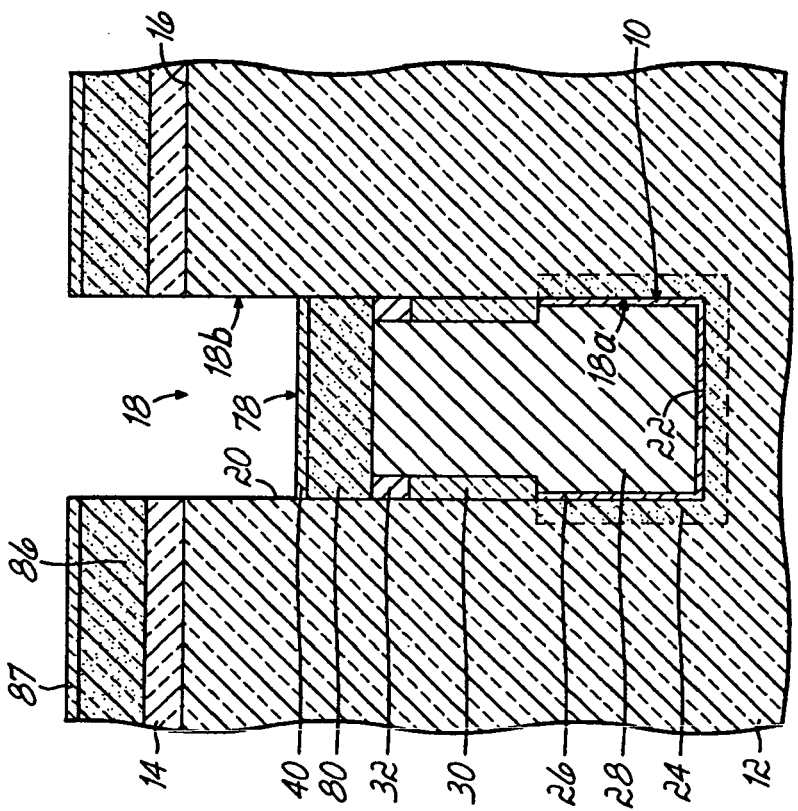

With reference to FIG. 5 in which like reference numerals refer to like features in FIG. 1 and in accordance with this alternative embodiment, a trench top oxide 78 is formed atop of the node electrode 28 and the buried strap 32. The trench top oxide 78 includes a doped layer 80 of a dielectric material containing first and second dopants of different conductivity types. More specifically, the doped layer 80 may comprise a borophosphosilicate glass (BPSG), which has a composition that contains boron as a p-type dopant and phosphorus as an n-type dopant, that is deposited on the buried strap 32 and the node electrode 28 by any suitable process (i.e., HDPCVD). The dopant concentrations in the doped layer 80 of the trench top oxide 78 are selected such that the phosphorus concentration in the composition is significantly higher than the boron concentration. Advantageously, the phosphorus concentration in the material constituting the doped layer 80 may be in the range of $1 \times 10^{19}$ cm$^{-3}$ to $1 \times 10^{21}$ cm$^{-3}$ and the boron concentration may be one order of magnitude or more lower than the phosphorus concentration. Alternatively, the doped layer 80 may be composed of a dielectric, such as an oxide, with a composition containing boron and arsenic in an appropriate concentration and proportion. The optional undoped cap layer 40 may comprise oxide, nitride, and/or oxynitride deposited in deep trench 18 atop the doped layer 80. When layers 40, 80 are formed, extraneous layers 86, 87 of the materials forming the layers 40, 80 may be formed on the pad layer 14 and are removed during subsequent fabrication stages.

Figure 6:
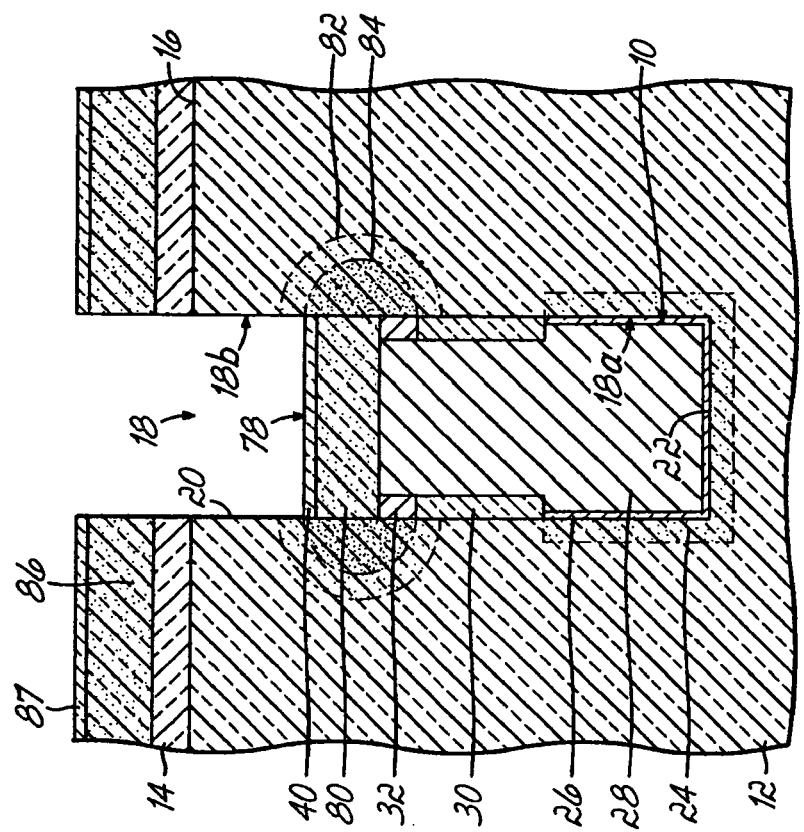

With reference to FIG. 6 in which like reference numerals refer to like features in FIG. 5 and at a subsequent fabrication stage, the dopants in the doped layer 80 are thermally diffused from the trench top oxide 78 into the semiconductor material of the substrate 12 bordering the sidewall 20 of deep trench 18. Advantageously, the dopants have different diffusion coefficients in the constituent semiconductor material of substrate 12 such that a first dopant from the two dopants diffuses a greater distance from the doped layer 80 into the semiconductor material than the second dopant. The faster diffusing dopant defines a halo region 82 in the semiconductor material of substrate 12 adjacent to the trench top oxide 78.

Circumscribed by the halo region 82 is a lower source/drain region 84 containing both diffused dopants but the concentration of the slower diffusing dopant is significantly higher than the concentration of the faster diffusing dopant. The difference in dopant concentrations is sufficient such that the net doping of the first and second dopants in the lower source/drain region 84 provides the lower source/drain region 84 with an opposite conductivity to the halo region 82. The dopant concentration, thickness of doped layer 80, and the thermal process are designed such that the electrical junction between the halo region 82 and the lower source/drain region 84 is at, or slightly, above the top surface of the trench top oxide 78. The undoped cap layer 40, if present, prevents undesired dopant diffusion from the doped layer 80 to semiconductor material of substrate 12 bordering the upper portion 18b of the deep trench 18.

Specifically, if the doped layer 80 is composed of BPSG containing boron and phosphorus, boron in the BPSG of doped layer 80 serves as a dopant source for the thermal outdiffusion forming the halo region 82. Phosphorus in the BPSG composing doped layer 80 serves as a dopant source for the thermal outdiffusion forming the lower source/drain region 84. If the substrate 12 is silicon, boron is known by a person having ordinary skill in the art to diffuse faster than phosphorus in a matrix of silicon. In this instance, the faster diffusing boron from the BPSG in the doped layer 80 defines the halo region 82 (which is boron doped) in the semiconductor material of substrate 12 adjacent to the trench top oxide 78. The lower source/drain region 84, which is circumscribed by and self-aligned with the halo region 82, contains both boron and phosphorus but the concentration of phosphorus is significantly higher than the boron concentration so that the net doping provides a conductivity (n-type) that is opposite to the conductivity (i.e., p-type) of the halo region 82.

The halo region 82 and the lower source/drain region 84 are self-aligned with the doped layer 80 because the respective dopants each diffuse into the semiconductor material of substrate 12 from the doped layer 80. In other words, the halo region 82 and lower source/drain region 84 are disposed at the same, or substantially the same, depth from the top surface 16 of the substrate 12 as the doped layer 80. Because both dopants of opposite conductivity type originate from the same source (i.e., the doped layer 80), the halo region 82 and lower source/drain region 84 are also self-aligned with each other. Although self-aligned, the effect of the difference in diffusion coefficient or diffusivity of the dopants is that the lower source/drain region 84 and the halo region 82 are at least partially non-overlapping and, hence, the halo region 82 created by the dopant with the higher diffusivity circumscribes the lower source/drain region 84 created by the dopant of lower diffusivity.

With reference to FIG. 7 in which like reference numerals refer to like features in FIG. 6 and at a subsequent fabrication stage, the fabrication of a vertical transistor 88 in deep trench 18 is completed with process analogous to those described above with regard to vertical transistor 54 (FIG. 4), including forming the upper source/drain region 62. At least a portion of the halo region 82 is disposed between the lower source/drain region 84 and the upper source/drain region 62 and, therefore, between the lower source/drain region 84 and the channel region 76. The p-type well 60, the dielectric layer 64, the wordline 66, the sidewall spacers 72, 74, and the bitline contact 68 are also formed as described above with regard to FIG. 4.

In another alternative embodiment of the present invention, a self-aligned halo region, which is analogous to halo region 50 (FIG. 3), may be formed in a vertical transistor that is not associated with a memory cell. In particular, the halo region may be formed using a doped layer stack similar to the trench top oxide 34 described above with regard to FIGS. 1-4. The halo region is self-aligned with a lower source/drain region of the vertical transistor.

With reference to FIG. 8 in which like reference numerals refer to like features in FIG. 1 and in accordance with this alternative embodiment, trenches, of which a trench 90 is representative, are formed in the semiconductor substrate 12 by a conventional lithography and etching process. The lithography process applies a resist (not shown) on pad layer 14, exposes the resist to a pattern of radiation to impart a latent trench pattern, and develops the latent trench pattern in the exposed resist. The trench pattern is transferred from the resist to the pad layer 14 using the patterned resist as an etch mask for an anisotropic dry etching process, such as an RIE process or a plasma etching process. After the resist is stripped, the trench pattern is transferred from the pad layer 14 to the substrate 12 using the patterned pad layer 14 as a hardmask for another anisotropic etch process that selectively removes the constituent material of the substrate 12 across unmasked areas of top surface 16. The trench 90 has a sidewall 92 that encircles the trench 90 to define a peripheral boundary and extends in a direction substantially perpendicular or vertical to the top surface 16 of the substrate 12. A bottom wall or base 94 defines a bottom boundary of the trench 90 in the substrate 12 and is intersected by the sidewall 92.

A lower doped layer 96 of the layer stack 95 is deposited in the trench 90 and is coextensive with the base 94. An upper doped layer 98 of the layer stack 95 is deposited in the trench 90 and is coextensive with the lower doped layer 96. The characteristics of the lower and upper doped layers 96, 98 are substantially similar or identical to the characteristics of the lower and upper doped layers 36, 38, as described above with regard to FIG. 2. An optional undoped cap layer 100, analogous to cap layer 40 (FIG. 2), may be applied on the upper doped layer 98. Extraneous layers 103, 105, 107 of the materials forming the layers 96, 98, 100 may be formed on the pad layer 14 when layers 96, 98, 100 are formed.

Figure 9:
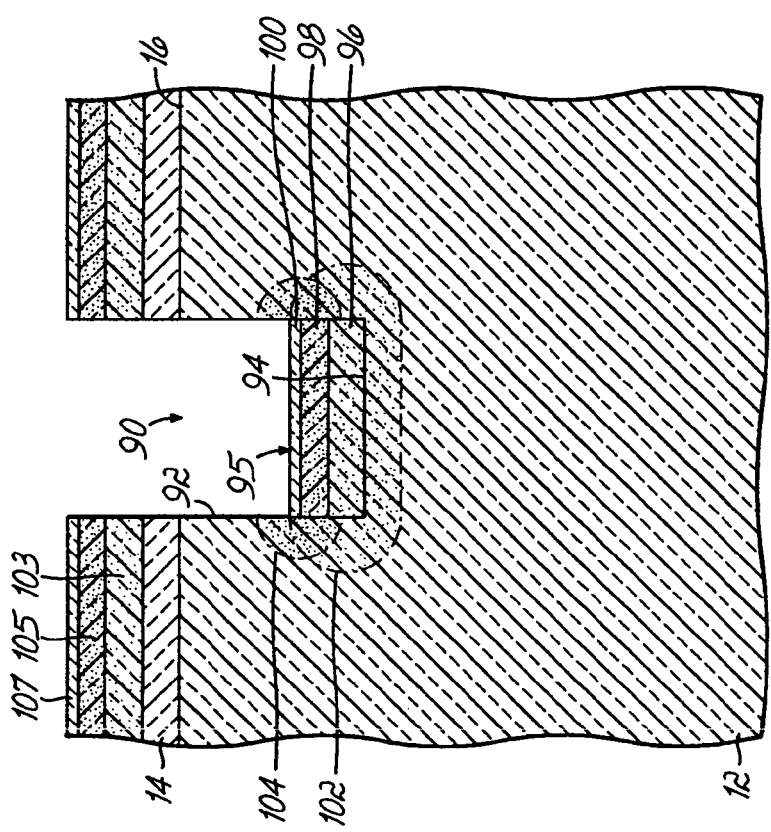

With reference to FIG. 9 in which like reference numerals refer to like features in FIG. 8 and at a subsequent fabrication stage, a lower source/drain region 102 of a vertical transistor 106 (FIG. 10) is formed in the semiconductor material of the substrate 12 bounding the sidewall 92 of trench 90 by outdiffusion of dopant (e.g., arsenic) originating from the lower doped layer 96 of layer stack 95. Similarly, a halo region 104 of the vertical transistor 106 is formed in the semiconductor material of the substrate 12 near the sidewall 92 of trench 90 by outdiffusion of dopant (e.g., boron) originating from the upper doped layer 98 of layer stack 95. The dopant outdiffusion is driven by a thermal anneal at a sufficient temperature and sufficient duration and also by dopant concentration gradients. Alternatively, subsequent fabrication stages may heat the substrate 12 and the upper and lower doped layers 96, 98 to a temperature and for a duration sufficient to cause the requisite outdiffusion.

At least a portion of the halo region 104 is disposed vertically between lower source/drain region 102 and the top surface 16 of substrate 12. The halo region 104 is self-aligned with the upper doped layer 98 in that the halo region 104 is disposed at the same, or substantially the same, depth from the top surface 16 of the substrate 12 as the upper doped layer 98. Similarly, the lower source/drain region 102 is self-aligned with the lower doped layer 96 such that the lower source/drain region 102 is disposed at the same, or substantially the same, depth from the top surface 16 of the substrate 12 as the lower doped layer 96. Because of the spatial relationship between the lower and upper doped layers 96, 98, the lower source/drain region 102 and halo region 104 are self-aligned with each other. The lower source/drain region 102 and halo region 104 also extend in the semiconductor material of substrate 12 below the base 94 of the trench 90, as well as laterally of the sidewall 92, and are at least partially non-overlapping so that a portion of the halo region 104 nearest to the top surface 16 is doped with a negligible amount of the dopant forming the lower source/drain region 102 or is undoped by the dopant forming the lower source/drain region 102.

Figure 10:
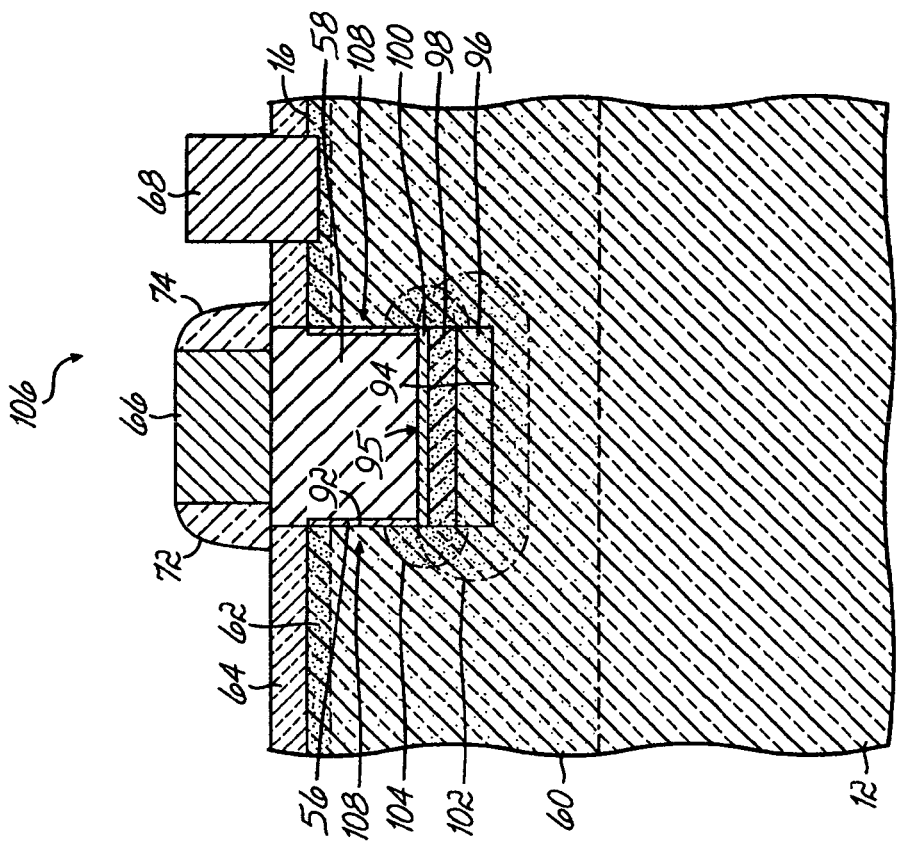

The dopant concentration in the lower doped layer 96 is initially chosen to be significantly higher than the dopant concentration in the upper doped layer 98 so that the upper junction between the overlapping lower source/drain region 102 and halo region 104 is at the same depth relative to, or slightly above, a top surface of the trench top oxide 95. This arrangement assists in the subsequent fabrication stages that form the vertical transistor 106 (FIG. 10). Advantageously, the initial dopant (e.g., arsenic) concentration in the lower doped layer 96 may be in the range of $1\times10^{19}$ cm$^{-3}$ to $1\times10^{21}$ cm$^{-3}$ and the initial dopant (e.g., boron) concentration in the upper doped layer 98 may be an order of magnitude or more (i.e., greater than a factor of 10) lower than the initial dopant concentration in the lower doped layer 96.

With reference to FIG. 10 in which like reference numerals refer to like features in FIG. 9 and at a subsequent fabrication stage, the fabrication of the vertical transistor 106 in trench 90 is completed as described above with regard to vertical transistor 54 (FIG. 4), including forming the upper source/drain region 62. The p-type well 60, the dielectric layer 64, the wordline 66, the sidewall spacers 72, 74, and the bitline contact 68 are also formed as described above with regard to FIG. 4. A channel region 108 is defined in the semiconductor material of substrate 12 bordering the trench 90 near the gate electrode 58. The channel region 108 is disposed between the upper source/drain region 62 and the halo region 104 and, thus, is disposed as an intervening region of the semiconductor material of substrate 12 between the upper and lower source/drain regions 62, 102. The channel region 108 is not doped by dopant outdiffused from the lower and upper doped layers 96, 98 nor by the process forming the upper source/drain region 62.

In another alternative embodiment of the present invention, a self-aligned halo region, which is analogous to halo region 82 (FIG. 6), may be formed in a vertical transistor that is not associated with a memory cell. In particular, the halo region may be formed using a layer stack that comprises a single doped layer of a material containing two dopants of opposite conductivity types and is similar in construction to the trench top oxide 78 described above with regard to FIGS. 5-7.

Figures 11, 12:
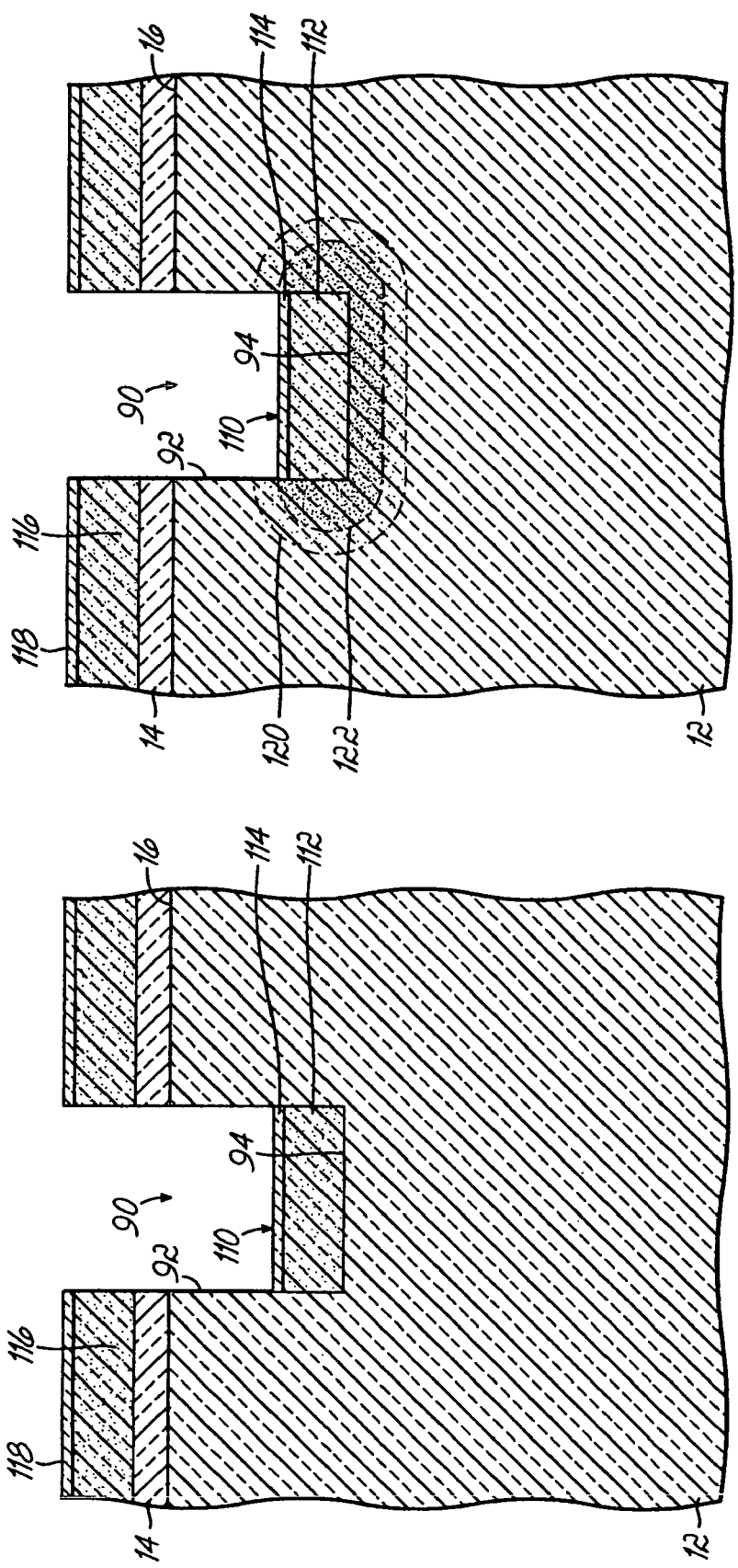
FIGS. 11-13 are diagrammatic cross-sectional views of a portion of a substrate at successive fabrication stages of a processing method in accordance with an embodiment of the present invention.

With reference to FIG. 11 in which like reference numerals refer to like features in FIG. 8 and in accordance with this alternative embodiment, the doped layer 112 is composed of a material containing a p-type dopant and further containing an n-type dopant, as described above with regard to doped layer 80 (FIGS. 5-7), is deposited in trench 90. An optional undoped cap layer 114 of the layer stack 110, which is analogous to cap layer 40 (FIGS. 5-7) is deposited atop the doped layer 112. Extraneous layers 116, 118 of the materials forming layers 112, 114 may be formed on the pad layer 14 when layers 116, 118 are formed.

With reference to FIG. 12 in which like reference numerals refer to like features in FIG. 11 and at a subsequent fabrication stage, the dopants in the doped layer 112 are thermally diffused into the semiconductor material of the substrate 12 bordering the sidewall 92 of trench 90 to form a halo region 120 and a lower source/drain region 122, as described above with regard to halo region 82 and lower source/drain region 84 (FIG. 6). The dopant outdiffusion is driven by a thermal anneal at a sufficient temperature and duration and by the dopant concentration gradients. Alternatively, subsequent fabrication stages may heat the substrate 12 and doped layer 112 to a temperature and for a duration sufficient to cause the requisite outdiffusion.

The halo region 120 and the lower source/drain region 122 are self-aligned with the doped layer 112 because the respective dopants each diffuse into the semiconductor material of substrate 12 from the doped layer 112. In other words, the halo region 120 and lower source/drain region 122 are disposed at the same, or substantially the same, depth from the top surface 16 of the substrate 12 as the doped layer 112. Because both dopants originate from the doped layer 112, the halo region 120 and lower source/drain region 122 are also self-aligned with each other. The halo region 120 and lower source/drain region 122 also extend in the semiconductor material of substrate 12 below the base 94 of the trench 90, as well as laterally of the sidewall 92. A portion of the halo region 102 is either undoped by the dopant of the lower source/drain region 122 or contains a negligible concentration of the dopant of the lower source/drain region 122.

Figure 13:
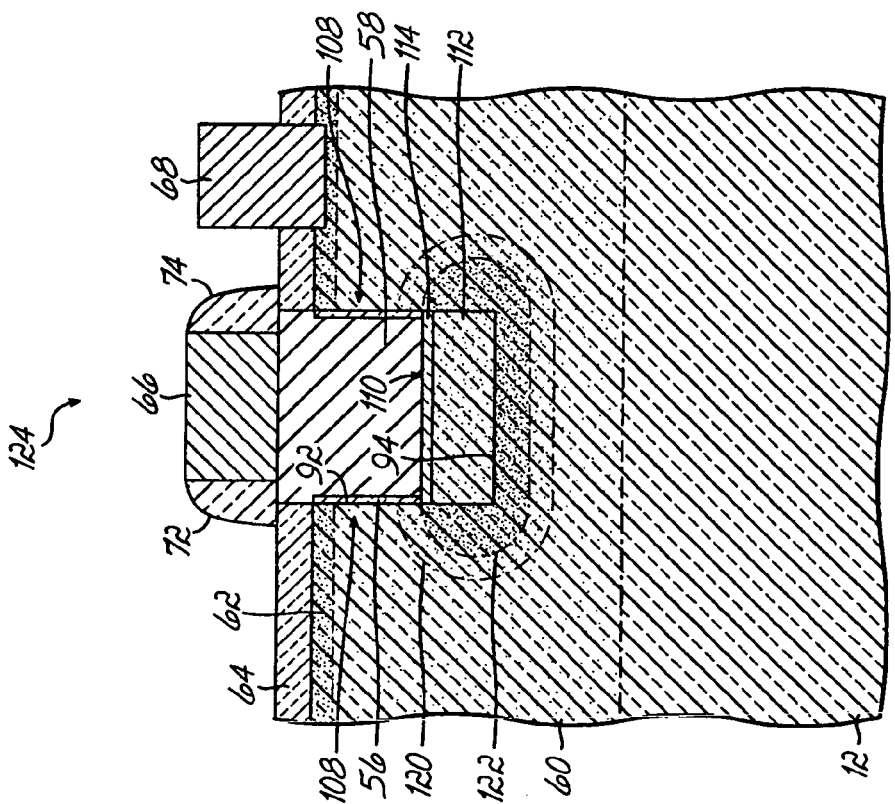

With reference to FIG. 13 in which like reference numerals refer to like features in FIG. 12 and at a subsequent fabrication stage, the fabrication of a vertical transistor 124 in trench 90 is completed as described above with regard to vertical transistor 54 (FIG. 4), including forming the upper source/drain region 62. At least a portion of the halo region 120 is disposed between the lower source/drain region 122 and the upper source/drain region 62 and, therefore, between the lower source/drain region 122 and the channel region 108. The p-type well 60, the dielectric layer 64, the wordline 66, the sidewall spacers 72, 74, and the bitline contact 68 are also formed as described above with regard to FIG. 4.

In yet another alternative embodiment of the present invention, a source/drain extension and a second self-aligned halo region may be formed proximate to an upper source/drain region of a vertical transistor having the self-aligned halo region and lower source drain region. This alternative embodiment of the present invention applies equally to the embodiments with vertical transistor 54 (FIG. 4), vertical transistor 88 (FIG. 7), vertical transistor 106 (FIG. 10), and vertical transistor 124 (FIG. 12), but is illustrated in conjunction with a vertical transistor similar to vertical transistor 106.

Figure 14:
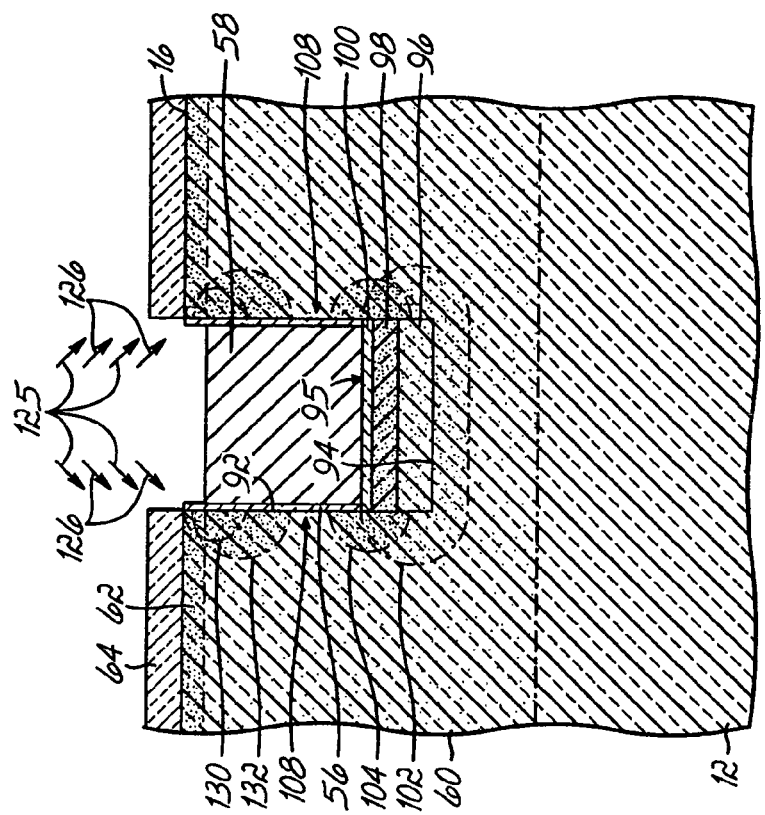
FIGS. 14 and 15 are diagrammatic cross-sectional views of a portion of a substrate at successive fabrication stages of a processing method in accordance with an embodiment of the present invention.

With reference to FIG. 14 in which like reference numerals refer to like features in FIG. 9 and at a subsequent fabrication stage, the gate dielectric 56 and gate electrode 58 of a vertical transistor 146 (FIG. 15) are formed as described above with regard to FIG. 5. The conductor of the gate electrode 58 is recessed slightly relative to the gate dielectric 56 by, for example, an RIE process selective to the dielectric material of the gate dielectric 56. Advantageously, a top surface of the recessed gate electrode 58 is approximately level with the upper source/drain region 62.

A source/drain extension 130 for the upper source/drain region 62 is defined in the semiconductor material of substrate 12 near the recessed top of the gate electrode 56 by an angled implantation of ions 125. The ions 125 penetrate through the sidewall 92 of trench 90 across the space in trench 90 above the recessed gate electrode 56. The conductivity types of the source/drain extension 130 and the upper source/drain region 60 are identical and the same as the lower source drain region 84. For example, the ions 125 may comprise n-type dopant (e.g., arsenic, phosphorus, or antimony) implanted at energies in the range of about 30 keV to about 70 keV and at a dose of about $1 \times 10^{14}$ cm$^{-2}$ to about $1 \times 10^{15}$ cm$^{-2}$ to form the source/drain extension 130 of an n-channel vertical transistor 146. Similarly, for a P-channel vertical transistor 146, the ions 125 may comprise a p-type dopant (e.g., boron or indium) implanted at a suitable energy and dose for forming the source/drain extension 130.

A halo region 132 for the upper source/drain region 62 is defined in the semiconductor material of substrate 12 near the recessed top of the gate electrode 56 by an angled implantation of ions 126. The ions 126 penetrate through the sidewall 92 of trench 90 across the space in trench 90 above the recessed gate electrode 56. For example, the ions 126 may comprise a p-type dopant (e.g., boron or indium) implanted at an energy in the range of about 10 keV to about 50 keV and at a dose of about $1 \times 10^{12}$ cm$^{-2}$ to about $1 \times 10^{14}$ cm$^{-2}$ for forming the halo region 132 of an N-channel vertical transistor 106. Similarly, for a P-channel vertical transistor 106, the ions 126 may comprise an n-type dopant (e.g., arsenic, phosphorus, or antimony) implanted at a suitable energy and dose for forming the halo region 132. In any event, the dopant of the halo region 132 has an opposite conductivity type than the dopant of the upper source/drain region 62 and source/drain extension 130. The halo region 132 extends toward the channel region 108 beyond an end of the source/drain extension 130.

The ions 125, 126 penetrate through the sidewall 92 of trench 90 across the space in trench 90 above the recessed gate electrode 56. The incident angle of the ions 125, 126, which is measured from vertical, may be in a range of approximately 20° to approximately 60° degrees, which is contingent among other factors upon the dimensions of the trench 90. Optionally, the angled implantations of ions 125, 126 may be followed by a thermal anneal at a substrate temperature of, for example, 900° C. to 1000° C. to activate and distribute the dopants in the source/drain extension 130 and halo region 132.

The source/drain extension 130 and halo region 132 are self-aligned with each other. The invention contemplates that the source/drain extension 130 and halo region 132 may be used in conjunction with the halo region 104 associated with the lower source/drain region 102. Alternatively, the source/drain extension 130 and halo region 132 may be advantageous for certain semiconductor device structures in the absence of halo region 104.

Figure 15:
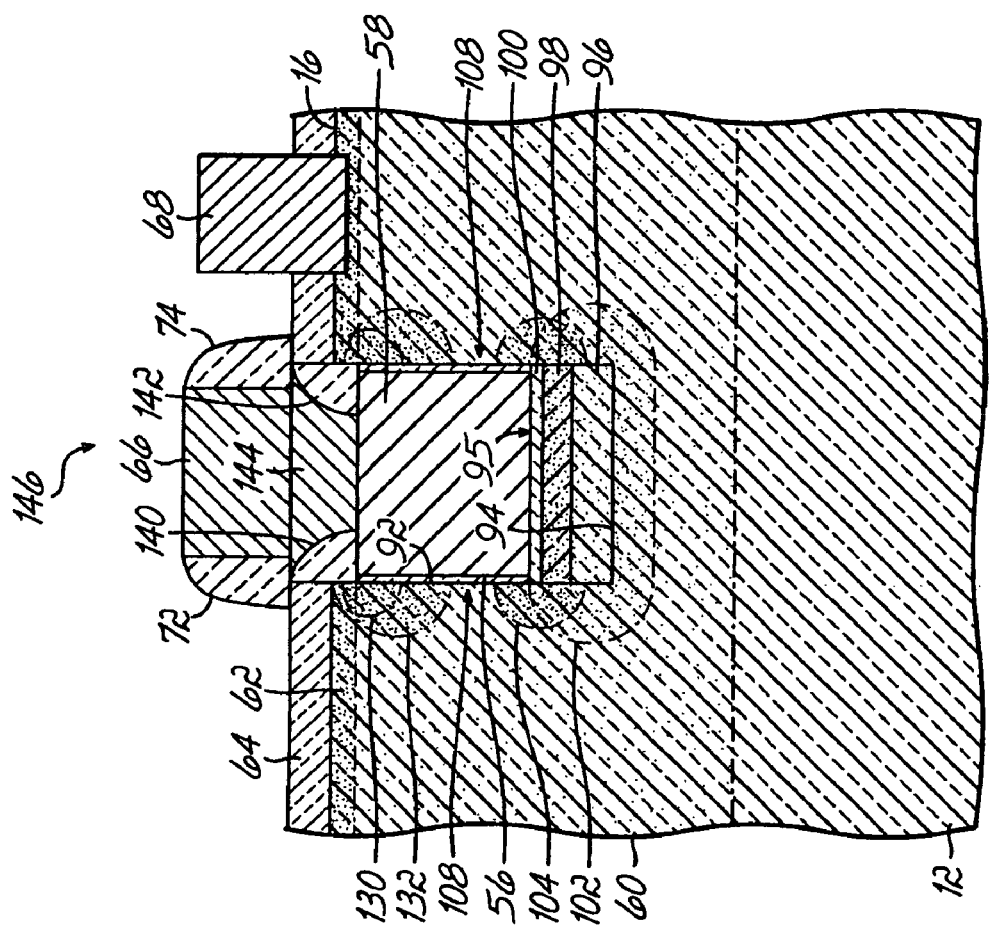

With reference to FIG. 15 in which like reference numerals refer to like features in FIG. 14 and at a subsequent fabrication stage, spacers 140, 142 are formed using conventional processing steps. The spacers 140, 142 may comprise any appropriate insulating material, such as, for example, oxide or nitride formed by a conventional technique, such as conformal deposition using a CVD process of an insulating layer followed by an anisotropic RIE process. After spacers 140, 142 are formed, a contact 144 of a conductive material, such as a metal like tungsten or tantalum, a silicide, a metallic nitride, or doped polysilicon, or combinations of these materials, is deposited to fill the open space between the spacers 140, 142 above the recessed gate electrode 56. Extraneous conductive material is removed by a conventional planarization process, such as a CMP process, to a make a top surface of the contact 144 substantially coplanar with a top surface of the dielectric layer 64. An optional diffusion barrier liner (not shown) of a suitable conductive material may be deposited before deposition of the conductive material of contact 144.

The fabrication of vertical transistor 146 in trench 90 is completed, as described above with regard to vertical transistor 54 (FIG. 4), including forming the upper source/drain region 62. The source/drain extension 130 and halo region 132 extend into the channel region 108 of the vertical transistor 146 between the upper and lower source/drain regions 62, 102, which is effectively shortened by the source/drain extension 130 and halo region 132. The p-type well 60, the dielectric layer 64, the wordline 66, the sidewall spacers 72, 74, and the bitline contact 68 are also formed as described above with regard to FIG. 4.

References herein to terms such as "vertical", "horizontal", etc. are made by way of example, and not by way of limitation, to establish a frame of reference. The term "horizontal" as used herein is defined as a plane parallel to the top surface 16, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor device structure formed in a trench defined in a substrate of a semiconductor material by a sidewall extending from a top surface of the substrate to a base, the semiconductor device structure comprising:

a first doped layer disposed in the trench, the first doped layer containing a dopant having a first conductivity type;

a second doped layer disposed in the trench between the first doped layer and the top surface, the second doped layer containing a dopant having a second conductivity type opposite to the first conductivity type;

a first doped region and a second doped region each defined in the semiconductor material of the substrate bordering the sidewall of the trench, the first and second doped regions having the first conductivity type, the first doped region positioned relative to the top surface at substantially the same depth as the first doped layer, and the second doped region positioned between the first doped region and the top surface;

a third doped region defined in the semiconductor material of the substrate bordering the sidewall of the trench, the third doped region positioned relative to the top surface at substantially the same depth as the second doped layer so that at least a portion of the third doped region is disposed between the first doped region and the second doped region, and the third doped region having the second conductivity type; and an intervening region of the semiconductor material of the substrate bordering the sidewall of the trench and disposed relative to the top surface between the second doped region and the third doped region.

2. The semiconductor device structure of claim 1 wherein the first and second doped regions comprise first and second source/drain regions of a field effect transistor, the third doped region comprises a halo region of the field effect transistor, and the intervening region comprises a channel region of the field effect transistor, and further comprising:

a gate electrode disposed in an upper portion of the trench juxtaposed with the channel region and extending in the trench between the first source/drain region and the halo region.

3. The semiconductor device structure of claim 2 further comprising:

a storage capacitor including a storage node of a conductive material disposed in a lower portion of the trench, the storage node electrically connected with the first source/drain region; and a conductive contact electrically connected with the second source/drain region.

4. The semiconductor device structure of claim 2 further comprising:

a storage capacitor electrically coupled with the first source/drain region.

5. The semiconductor device structure of claim 4 wherein the storage capacitor includes a node electrode in the trench, the further comprising:

a buried strap in the trench, the buried strap electrically connecting the node electrode with the first source/drain region.

6. The semiconductor device structure of claim 5 wherein the first doped layer and the second doped layer are disposed between the node electrode and the gate electrode.

7. The semiconductor device structure of claim 5 wherein the node electrode is composed of doped polycrystalline silicon.

8. The semiconductor device structure of claim 5 further comprising:

a buried capacitor plate defined in the semiconductor material of the substrate bordering the sidewall of the trench; and a node dielectric on the sidewall of the trench, the node dielectric disposed between the buried capacitor plate and the node electrode.

9. The semiconductor device structure of claim 8 further comprising:

an isolation collar on the sidewall of the trench, the isolation collar disposed between the node dielectric and the buried strap.

10. The semiconductor device structure of claim 1 wherein the first and third doped regions partially overlap to define a junction positioned near a top surface of the second doped layer.

11. The semiconductor device structure of claim 1 further comprising:

a third layer of an undoped material disposed in the trench between the second doped layer and the top surface.

12. The semiconductor device structure of claim 11 wherein the third layer is composed of a dielectric material.

13. The semiconductor device structure of claim 11 wherein the dielectric material is an undoped silicate glass.

14. The semiconductor device structure of claim 1 wherein the first conductivity type is n-type and the second conductivity type is p-type.

15. The semiconductor device structure of claim 1 wherein the first doped layer is composed of arsenic doped silicate glass and the second doped layer is composed of a boron-doped silicate glass.

16. The semiconductor device structure of claim 1 wherein the dopant contained in the first doped layer is arsenic and the dopant contained in the second doped layer is boron.

17. The semiconductor device structure of claim 1 wherein the first doped layer and the second doped layer each have a thicknesses ranging between about 5 nm and about 20 nm.

18. The semiconductor device structure of claim 1 wherein the first conductivity type of the first doped region is supplied by a portion of the dopant from the first doped layer and the second conductivity type of the third doped region is supplied by a portion of the dopant diffusing from the second doped layer.

* * * * *